US012672478B2

(12) United States Patent　　　(10) Patent No.:　US 12,672,478 B2
Song et al.　　　　　　　　　　　　(45) Date of Patent:　Jun. 30, 2026

(54) METHOD OF INSPECTING DISPLAY PANEL AND MANUFACTURING METHOD OF DISPLAY PANEL

(71) Applicant: Samsung Display Co., Ltd., Yongin-si (KR)

(72) Inventors: Jae-Jin Song, Hwaseong-si (KR); Kwangsae Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 583 days.

(21) Appl. No.: 18/097,717

(22) Filed: Jan. 17, 2023

(65) Prior Publication Data

US 2023/0320186 A1　　　Oct. 5, 2023

(30) Foreign Application Priority Data

Mar. 29, 2022　　(KR) ........................ 10-2022-0038754

(51) Int. Cl.
　　H10K 71/70　　　(2023.01)
　　G09G 3/3233　　(2016.01)
　　H10K 59/12　　　(2023.01)
(52) U.S. Cl.
　　CPC ........... H10K 71/70 (2023.02); G09G 3/3233 (2013.01); H10K 59/1201 (2023.02); G09G 2300/0819 (2013.01); G09G 2300/0842 (2013.01); G09G 2310/08 (2013.01)
(58) Field of Classification Search
　　CPC .. H10K 71/70; H10K 59/1201; G09G 3/3233; G09G 2300/0819; G09G 2300/0842; G09G 2310/08; G09G 2330/10; G09G 2330/12; G09G 3/006; G09G 2300/0861; G09G 2310/0251; G09G 2320/045; G09G 3/20; G09G 2300/0426; G09G 2300/0809; G01R 31/2825; G01R 31/2839; G01R 31/66
See application file for complete search history.

(56) References Cited

U.S. PATENT DOCUMENTS

| | | | | |
|---|---|---|---|---|
| 8,395,609 | B2 * | 3/2013 | Kwak | ................... G09G 3/3233 |
| | | | | 345/206 |
| 8,904,587 | B1 * | 12/2014 | Patterson | ................ A47L 23/06 |
| | | | | 15/97.1 |
| 9,066,408 | B2 | 6/2015 | Choi et al. | |
| 9,786,222 | B2 | 10/2017 | Lim et al. | |

(Continued)

FOREIGN PATENT DOCUMENTS

| | | |
|---|---|---|
| KR | 20160018892 A | 2/2016 |
| KR | 1020170018126 A | 2/2017 |

(Continued)

*Primary Examiner* — Jarrett J Stark
(74) *Attorney, Agent, or Firm* — CANTOR COLBURN LLP

(57) ABSTRACT

A method of inspecting a display panel includes testing a pixel circuit including a plurality of transistors and a capacitor in the display panel. The testing of the pixel circuit includes: providing a first test voltage to a first node to which a first electrode of the capacitor is connected, providing a second test voltage different from the first test voltage to a second node to which a second electrode of the capacitor is connected, and detecting a defect in the pixel circuit through a test transistor connected to the first node among the plurality of transistors.

20 Claims, 13 Drawing Sheets

(56)　　　　　　References Cited

U.S. PATENT DOCUMENTS

| | | | | |
|---|---|---|---|---|
| 10,354,584 | B2 | 7/2019 | Gong et al. | |
| 10,553,659 | B2 | 2/2020 | Kim et al. | |
| 10,909,923 | B2 | 2/2021 | Kim et al. | |
| 2004/0263460 | A1 * | 12/2004 | Lu ........................... | G09G 3/006 |
| | | | | 345/98 |
| 2010/0259527 | A1 * | 10/2010 | Odawara .............. | G09G 3/3233 |
| | | | | 345/76 |
| 2020/0302840 | A1 * | 9/2020 | Kim ....................... | G09G 3/006 |
| 2023/0085612 | A1 * | 3/2023 | Park ....................... | G09G 3/006 |
| | | | | 324/537 |
| 2023/0095094 | A1 * | 3/2023 | Koo ........................ | G09G 3/32 |
| | | | | 345/214 |
| 2023/0320186 | A1 * | 10/2023 | Song ..................... | G09G 3/006 |
| | | | | 438/17 |

FOREIGN PATENT DOCUMENTS

| | | | |
|---|---|---|---|
| KR | 20180058282 | A | 6/2018 |
| KR | 20200113089 | A | 10/2020 |
| KR | 1020200129242 | A | 11/2020 |
| KR | 102209387 | B1 | 2/2021 |

* cited by examiner

METHOD OF INSPECTING DISPLAY PANEL AND MANUFACTURING METHOD OF DISPLAY PANEL

This application claims priority to Korean Patent Application No. 10-2022-0038754 filed on Mar. 29, 2022, and all the benefits accruing therefrom under 35 U.S.C. § 119, the content of which in its entirety is herein incorporated by reference.

BACKGROUND

Embodiments of the present disclosure described herein relate to a method of inspecting a display panel and a manufacturing method of the display panel.

A display panel includes a plurality of pixels and driving circuits (e.g., a scan driving circuit, a data driving circuit, and a light emission driving circuit) for controlling the plurality of pixels. Each of the plurality of pixels includes a light emitting element and a pixel circuit for controlling the light emitting element. The pixel circuit may include a plurality of thin film transistors, which are organically connected to one another. A driving current provided to the light emitting element is controlled by the plurality of thin film transistors. Accordingly, when the plurality of thin film transistors does not operate properly or wirings connecting them are cut or shorted, the driving current cannot be normally provided to the light emitting element. Accordingly, it is desirable to check whether the thin film transistors of the pixel circuit operate normally to repair defects or to prevent subsequent processes from proceeding.

SUMMARY

Embodiments of the present disclosure provide a method for inspecting a pixel circuit included in a display panel.

Embodiments of the present disclosure provide a method of manufacturing a display panel including an operation of inspecting a pixel circuit.

According to an embodiment of the present disclosure, a method of inspecting a display panel includes testing a pixel circuit including a plurality of transistors and a capacitor in the display panel. The testing of the pixel circuit includes providing a first test voltage to a first node to which a first electrode of the capacitor is connected, providing a second test voltage different from the first test voltage to a second node to which a second electrode of the capacitor is connected, and detecting a defect in the pixel circuit through a test transistor connected to the first node among the plurality of transistors.

According to an embodiment, the plurality of transistors may include a first transistor including a first electrode, a second electrode connected to the second node, and a gate electrode connected to the first node, a second transistor connected between the first node and a data line, a third transistor connected to the first node and a first test voltage line, a fourth transistor connected to the second node and a second test voltage line, and a fifth transistor connected to the first electrode of the first transistor and a third test voltage line, and the test transistor may be the second transistor.

According to an embodiment, the providing of the first test voltage may include turning on the third transistor, and transferring the first test voltage provided through the first test voltage line to the first node through the third transistor.

According to an embodiment, the providing of the second test voltage may include turning on the fourth transistor, and transferring the second test voltage provided through the second test voltage line to the second node through the fourth transistor.

According to an embodiment, the testing of the pixel circuit may further include providing a third test voltage different from the first and second test voltages to the second node, and the providing of the third test voltage may include turning on the fifth transistor, and transferring the third test voltage provided through the third test voltage line to the second node through the fifth transistor and the first transistor.

According to an embodiment, a level of the third test voltage may be greater than a level of the first test voltage and a level of the second test voltage.

According to an embodiment, the detecting of the defect in the pixel circuit may include turning on the second transistor, and measuring a voltage of the first node through the second transistor and the data line.

According to an embodiment, after the third transistor is turned on, the fourth transistor may be turned on, after the fourth transistor is turned off, the third transistor may be turned off, after both the third transistor and the fourth transistor are turned off, the fifth transistor may be turned on, and while the fifth transistor is turned on, the second transistor may be turned on and then turned off.

According to an embodiment, the detecting of the defect in the pixel circuit may include turning on the second transistor, and measuring a current flowing through the third transistor and the second transistor.

According to an embodiment, after the third transistor is turned on, the fourth transistor may be turned on, after the fourth transistor is turned on, the second transistor may be turned on, after the second transistor is turned off, the fourth transistor may be turned off, and after the fourth transistor is turned off, the third transistor may be turned off.

According to an embodiment, the providing of the second test voltage may include turning on the fifth transistor, and transferring the second test voltage provided through the third test voltage line to the second node through the fifth transistor and the first transistor.

According to an embodiment, the testing of the pixel circuit may further include providing a third test voltage different from the first and second test voltages to the second node, and the providing of the third test voltage may include turning on the fourth transistor, and transferring the third test voltage provided through the second test voltage line to the second node through the fourth transistor.

According to an embodiment, the detecting of the defect in the pixel circuit may include turning on the second transistor, and measuring a voltage of the first node through the second transistor and the data line.

According to an embodiment, after the third transistor is turned on, the fifth transistor may be turned on, after the fifth transistor is turned off, the third transistor may be turned off, after both the third transistor and the fifth transistor are turned off, the fourth transistor may be turned on, and while the fourth transistor is turned on, the second transistor may be turned on and then turned off.

According to an embodiment, the first test voltage may be a positive voltage, and the second test voltage may be a negative voltage.

According to an embodiment, an absolute value of the first test voltage may be the same as an absolute value of the second test voltage.

According to an embodiment of the present disclosure, a method of manufacturing a display panel includes forming a pixel circuit including a plurality of transistors and a capacitor in the display panel, testing the pixel circuit, and forming a light emitting element electrically connected with the pixel circuit. The plurality of transistors includes a first transistor including a gate electrode connected to a first node, a first electrode, a second electrode connected to a second node, a second transistor connected between the first node and a data line, a third transistor connected to the first node and a first test voltage line, a fourth transistor connected to the second node and a second test voltage line, and a fifth transistor connected to the first electrode of the first transistor and a third test voltage line, and the capacitor includes a first electrode connected to the first node and a second electrode connected to the second node. According to an embodiment, the testing of the pixel circuit may include providing a first test voltage to the first node, providing a second test voltage different from the first test voltage to the second node, and detecting a defect in the pixel circuit through the second transistor.

According to an embodiment, the testing of the pixel circuit may further include providing a third test voltage different from the first and second test voltages to the second node. According to an embodiment, the testing of the pixel circuit may further include providing a third test voltage different from the first and second test voltages to the second node, and the providing of the first test voltage may include turning on the third transistor, and transferring the first test voltage provided through the first test voltage line to the first node through the third transistor, and the providing of the second test voltage may include turning on the fourth transistor, and transferring the second test voltage provided through the second test voltage line to the second node through the fourth transistor, and the providing of the third test voltage may include turning on the fifth transistor, and transferring the third test voltage provided through the third test voltage line to the second node through the fifth transistor and the first transistor, and the detecting of the defect in the pixel circuit may include turning on the second transistor, and measuring a voltage of the first node through the second transistor and the data line.

According to an embodiment, the testing of the pixel circuit may further include providing a third test voltage different from the first and second test voltages to the second node, and the providing of the first test voltage may include turning on the third transistor, and transferring the first test voltage provided through the first test voltage line to the first node through the third transistor, and the providing of the second test voltage may include turning on the fifth transistor, and transferring the second test voltage provided through the third test voltage line to the second node through the fifth transistor and the first transistor, and the providing of the third test voltage may include turning on the fourth transistor, and transferring the third test voltage provided through the second test voltage line to the second node through the fourth transistor, and the detecting of the defect in the pixel circuit may include turning on the second transistor, and measuring a voltage of the first node through the second transistor and the data line.

According to an embodiment, the providing of the first test voltage may include turning on the third transistor, and transferring the first test voltage provided through the first test voltage line to the first node through the third transistor, and the providing of the second test voltage may include turning on the fourth transistor, and transferring the second test voltage provided through the second test voltage line to the second node through the fourth transistor, and the detecting of the defect in the pixel circuit may include turning on the second transistor, and measuring a current flowing through the third transistor and the second transistor.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
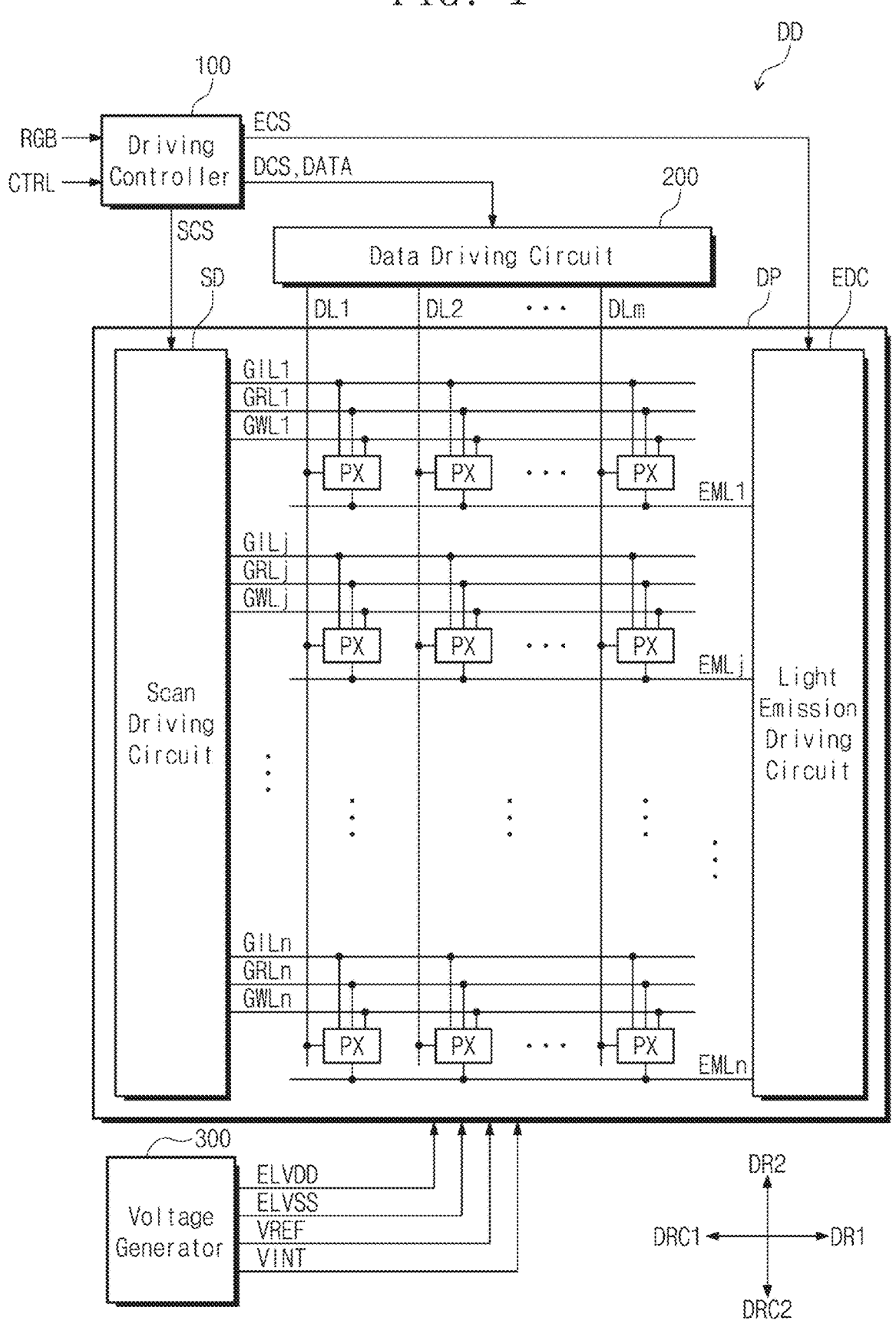
FIG. 1 is a block diagram illustrating a display device according to an embodiment of the present disclosure.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components are exaggerated for effectiveness of description of technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combinations of the associated listed items.

The terms "first", "second", etc. are used to describe various components, but the components are not limited by the terms. The terms are used only to differentiate one component from another component. For example, a first component may be named as a second component, and vice versa, without departing from the spirit or scope of the present disclosure. A singular form, unless otherwise stated, includes a plural form.

Also, the terms "under", "beneath", "on", "above" are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless defined otherwise, all terms (including technical and scientific terms) used herein have the same meaning as commonly understood by one of ordinary skill in the art to which this disclosure belongs. In addition, terms such as terms defined in commonly used dictionaries should be interpreted as having a meaning consistent with the meaning in the context of the related technology, and should not be interpreted as an ideal or excessively formal meaning unless explicitly defined in the present disclosure.

Hereinafter, embodiments of the present disclosure will be described with reference to accompanying drawings.

FIG. 1 is a block diagram illustrating a display device according to an embodiment of the present disclosure.

Referring to FIG. 1, a display device DD includes a display panel DP, a driving controller 100, a data driving circuit 200, and a voltage generator 300.

The driving controller 100 receives an image signal RGB and a control signal CTRL. The driving controller 100 generates an output image signal DATA obtained by converting a data format of the input image signal RGB so as to be suitable for the interface specification of the data driving circuit 200. The driving controller 100 outputs a scan driving signal SCS, a data driving signal DCS, and an emission driving signal ECS.

The data driving circuit 200 receives the data driving signal DCS and the output image signal DATA from the driving controller 100. The data driving circuit 200 converts the output image signal DATA into data signals and then outputs the data signals to a plurality of data lines DL1 to DLm to be described later. The data signals are analog voltages corresponding to grayscale values of the output image signal DATA.

The voltage generator 300 generates voltages necessary for an operation of the display panel DP. In an embodiment, the voltage generator 300 generates a first driving voltage ELVDD, a second driving voltage ELVSS, a reference voltage VREF, and an initialization voltage VINT.

The display panel DP includes scan lines GIL1 to GILn, GRL1 to GRLn, and GWL1 to GWLn, emission control lines EML1 to EMLn, data lines DL1 to DLm, and pixels PX. The display panel DP may further include a scan driving circuit SD and a light emission driving circuit EDC. The scan lines GIL1 to GILn may be referred to as first initialization scan lines GIL1 to GILn, the scan lines GRL1 to GRLn may be referred to as compensation scan lines GRL1 to GRLn, and the scan lines GWL1 to GWLn may be referred to as write scan lines GWL1 to GWLn.

The pixels PX may be arranged in a display area, and the scan driving circuit SD and the light emission driving circuit EDC may be arranged in a non-display area. However, the present disclosure is not limited thereto, and at least some of the pixels PX may overlap the scan driving circuit SD and the light emission driving circuit EDC. In this case, at least a portion of the scan driving circuit SD and at least a portion of the light emission driving circuit EDC may be disposed in the display area.

The scan driving circuit SD receives the scan driving signal SCS from the driving controller 100. The scan driving circuit SD may output scan signals to the scan lines GIL1 to GILn, GRL1 to GRLn, and GWL1 to GWLn in response to the scan driving signal SCS. The light emission driving circuit EDC receives the emission driving signal ECS from the driving controller 100. The light emission driving circuit EDC may output emission control signals to the emission control lines EML1 to EMLn in response to the emission driving signal ECS.

The scan driving circuit SD is arranged on a first side of the display panel DP. The scan lines GIL1 to GILn, GRL1 to GRLn, and GWL1 to GWLn extend from the scan driving circuit SD in a first direction DR1. The light emission driving circuit EDC is arranged on a second side of the display panel DP. The emission control lines EML1 to EMLn extend from the light emission driving circuit EDC in a direction DRC1 opposite to the first direction DR1. Each of the scan lines GIL1 to GILn, GRL1 to GRLn, and GWL1 to GWLn and each of the emission control lines EML1 to EMLn are arranged to be spaced apart from one another in a second direction DR2. The data lines DL1 to DLm extend from the data driving circuit 200 in a direction DRC2 opposite to the second direction DR2, and are arranged spaced from one another in the first direction DR1.

In an example illustrated in FIG. 1, the scan driving circuit SD and the light emission driving circuit EDC are arranged facing each other with the pixels PX interposed therebetween, but the present disclosure is not limited thereto. For example, the scan driving circuit SD and the light emission driving circuit EDC may be disposed adjacent to each other on one of the first side and the second side of the display panel DP. In an embodiment, the scan driving circuit SD and the light emission driving circuit EDC may be implemented with one circuit.

The display panel DP includes the scan lines GIL1 to GILn, GRL1 to GRLn, and GWL1 to GWLn, the emission control lines EML1 to EMLn, and data lines DL1 to DLm. Each of the plurality of pixels PX may be electrically connected to three scan lines, one emission control line, and one data line. For example, as illustrated in FIG. 1, the pixels PX in a first row may be connected to the scan lines GIL1, GRL1, and GWL1 and the emission control line EML1. In addition, the pixels PX in a j-th row may be connected to the scan lines GILj, GRLj, and GWLj and the emission control line EMLj.

Each of the plurality of pixels PX includes a light emitting element ED (refer to FIG. 2) and a pixel circuit PXC (refer to FIG. 2) for controlling the light emission of the light emitting element ED. The pixel circuit PXC may include one or more thin film transistors and one or more capacitors. The scan driving circuit SD and the light emission driving circuit EDC may include the thin film transistors formed through the same process as the pixel circuit PXC.

Each of the plurality of pixels PX receives the first driving voltage ELVDD, the second driving voltage ELVSS, the reference voltage VREF, and the initialization voltage VINT, from the voltage generator 300.

Figure 2:
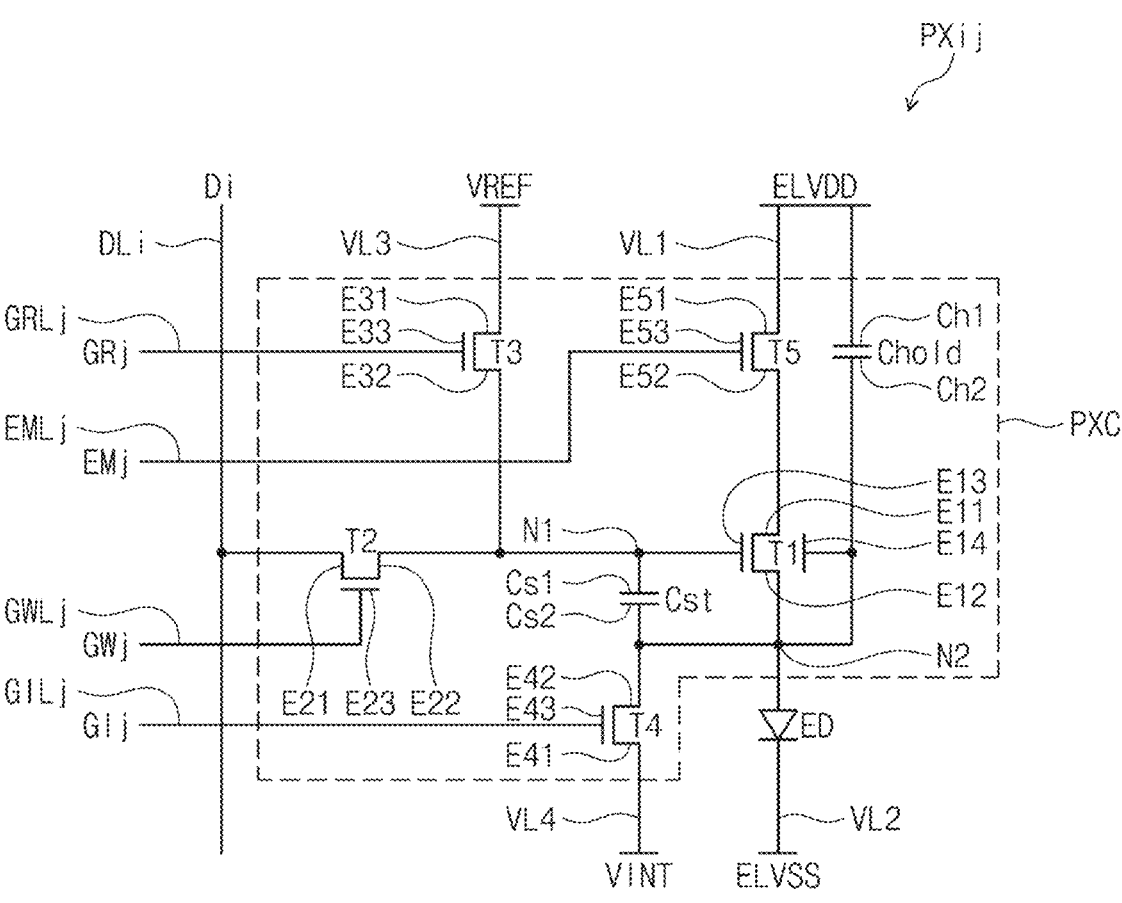
FIG. 2 is an equivalent circuit diagram of a pixel, according to an embodiment of the present disclosure.

FIG. 2 is an equivalent circuit diagram of a pixel PXij, according to an embodiment of the present disclosure.

Referring to FIGS. 1 and 2, an equivalent circuit diagram of a pixel PXij connected to the i-th data line DLi of the data lines DL1 to DLm, the j-th scan lines GILj, GRLj, and GWLj of the scan lines GIL1 to GILn, GRL1 to GRLn, and GWL1 to GWLn, and the j-th emission control line EMLj of the emission control lines EML1 to EMLn, is illustrated as an example. Each of the plurality of pixels PX illustrated in FIG. 1 may have the same circuit configuration as the equivalent circuit diagram of the pixel PXij illustrated in FIG. 2.

The pixel circuit PXC may include first to fifth thin film transistors T1, T2, T3, T4, and T5, a hold capacitor Chold, and a transfer capacitor Cst (or referred to as a capacitor). The pixel circuit PX illustrated in FIG. 2 is only an example. For example, the circuit configuration of the pixel PXij may be modified and implemented.

Each of the first to fifth transistors T1 to T5 may be an N-type thin film transistor having an oxide semiconductor layer. The first thin film transistor T1 may be referred to as a driving thin film transistor, the second thin film transistor T2 may be referred to as a switching thin film transistor, the third thin film transistor T3 may be referred to as a compensation thin film transistor, the fourth thin film transistor T4 may be referred to as an initialization thin film transistor, and the fifth thin film transistor T5 may be referred to as a light emission control thin film transistor.

The scan lines GILj, GRLj, and GWLj may transfer scan signals GIj, GRj, and Gwj, respectively, and the emission control line EMLj may transfer an emission control signal EMj. The data line DLi transfers a data signal Di. The data signal Di may have a voltage level corresponding to the image signal RGB input to the display device DD (refer to FIG. 1).

First to fourth driving voltage lines VL1 to VL4 may transfer the first driving voltage ELVDD, the second driving voltage ELVSS, the reference voltage VREF, and the initialization voltage VINT to the pixel Pxij, respectively.

The first thin film transistor T1 may include a first electrode E11 electrically connected to a first driving voltage line VL1 through the fifth thin film transistor T5, a second electrode E12 electrically connected to an anode of the light emitting element ED, a first gate electrode E13, and a second gate electrode E14. The first gate electrode E13 may be referred to as a gate electrode, and the second gate electrode E14 may be referred to as a back gate electrode. A portion where the second electrode E12 of the first thin film transistor T1 and the light emitting element ED are connected to each other may be defined as a second node N2.

The hold capacitor Chold is connected between the first driving voltage line VL1 and the second gate electrode E14. A first hold electrode Ch1 of the hold capacitor Chold is connected to the first driving voltage line VL1, and a second hold electrode Ch2 of the hold capacitor Chold is connected to the second gate electrode E14. In an embodiment of the present disclosure, the hold capacitor Chold may be omitted. Also, the first thin film transistor T1 may not include the second gate electrode E14.

The second thin film transistor T2 (or the test thin film transistor) includes a first electrode E21 connected to the data line DLi, a second electrode E22 connected to the first node N1, and a gate electrode E23 connected to the scan line GWLj. The second thin film transistor T2 transfers the data signal Di received through the data line DLi to the first node N1 in response to the scan signal GWj received through the scan line GWLj.

The transfer capacitor Cst (or a capacitor) is connected between the first node N1 and the second node N2. A first electrode Cs1 of the transfer capacitor Cst may be connected to the first node N1, and a second electrode Cs2 of the transfer capacitor Cst may be connected to the second node N2.

The third thin film transistor T3 includes a first electrode E31 connected to a third driving voltage line (or a reference voltage line) VL3, a second electrode E32 connected to the first node N1, and a gate electrode E33 connected to the scan line GRLj. The third thin film transistor T3 may be turned on depending on the scan signal GRj received through the scan line GRLj to transfer the reference voltage VREF to the first node N1.

The fourth thin film transistor T4 includes a first electrode E41 connected to a fourth driving voltage line (or an initialization voltage line) VL4, a second electrode E42 connected to the second node N2, and a gate electrode E43 connected to the scan line GILj. The fourth thin film transistor T4 transfers the initialization voltage VINT received through the fourth driving voltage line VL4 to the second node N2 in response to the scan signal GIj received through the scan line GILj.

The fifth thin film transistor T5 includes a first electrode E51 connected to the first driving voltage line VL1, a second electrode E52 connected to the first electrode E11 of the first thin film transistor T1, and a gate electrode E53 connected to the emission control line EMLj. The fifth thin film transistor T5 may be turned on by the emission control signal EMj received through the emission control line EMLj to electrically connect the first voltage line VL1 to the first electrode E11 of the first thin film transistor T1.

The light emitting element ED includes an anode connected to the second electrode E12 of the first thin film transistor T1 or to the second node, and a cathode connected to the second driving voltage line VL2.

A method of manufacturing the display panel DP may include forming the pixel circuit PXC including the first to fifth thin film transistors T1, T2, T3, T4, and T5, the hold capacitor Chold, and the transfer capacitor Cst, testing the pixel circuit PXC, and forming the light emitting element ED connected to the pixel circuit PXC.

The array test (or test) refers to testing whether at least some of the first to fifth thin film transistors T1, T2, T3, T4, and T5 operate normally. The array test of the pixel circuit PXC may be performed during the process of forming the pixel PXij. For example, the array test may be performed before the light emitting element ED is formed. When it is determined that the pixel circuit is defective through the array test, a repair process may be performed with respect to the pixel circuit, and when the repair of the pixel circuit is impossible, manufacturing of the pixel circuit may be terminated without proceeding to a subsequent process. Only when it is determined that the pixel circuit is normal through the array test, the light emitting element ED may be formed through a subsequent process. Waste of manufacturing time and manufacturing cost of the display panel DP may be reduced through the array test of the pixel circuit PXC. Hereinafter, a test operation of the pixel circuit PXC will be described in detail.

Figure 3:
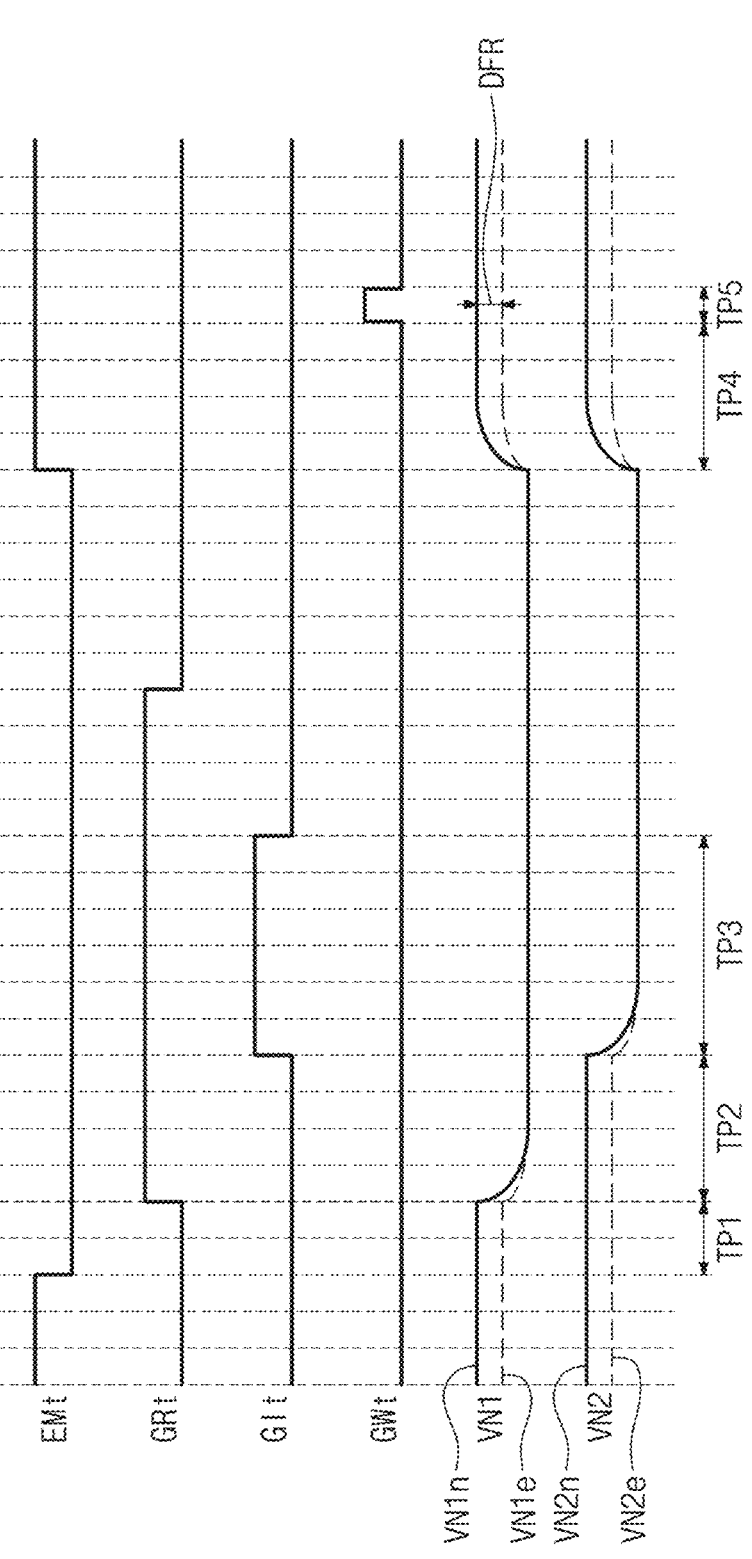
FIG. 3 is a timing diagram for describing a test operation of a pixel circuit, according to an embodiment of the present disclosure.
Figure 4A:
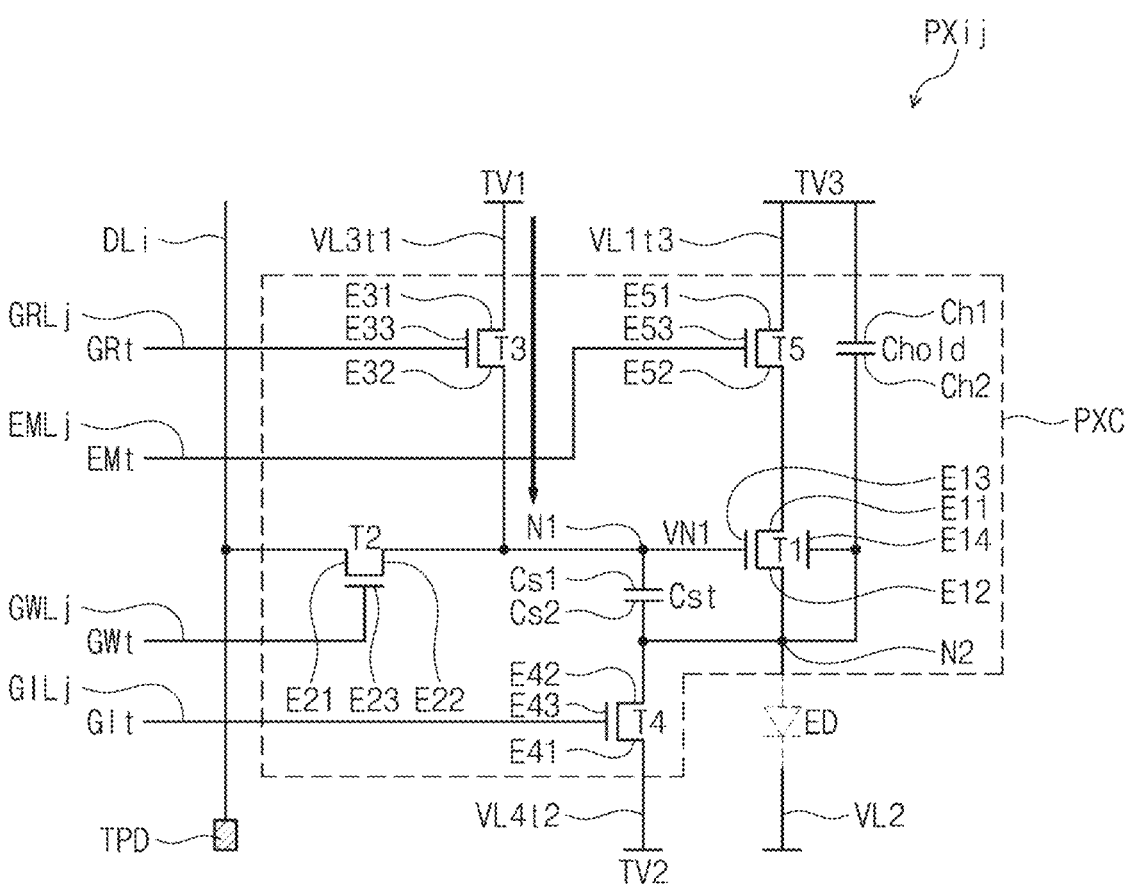
FIG. 4A is a diagram for describing an operation of a pixel circuit in a second section illustrated in FIG. 3.
Figure 4B:
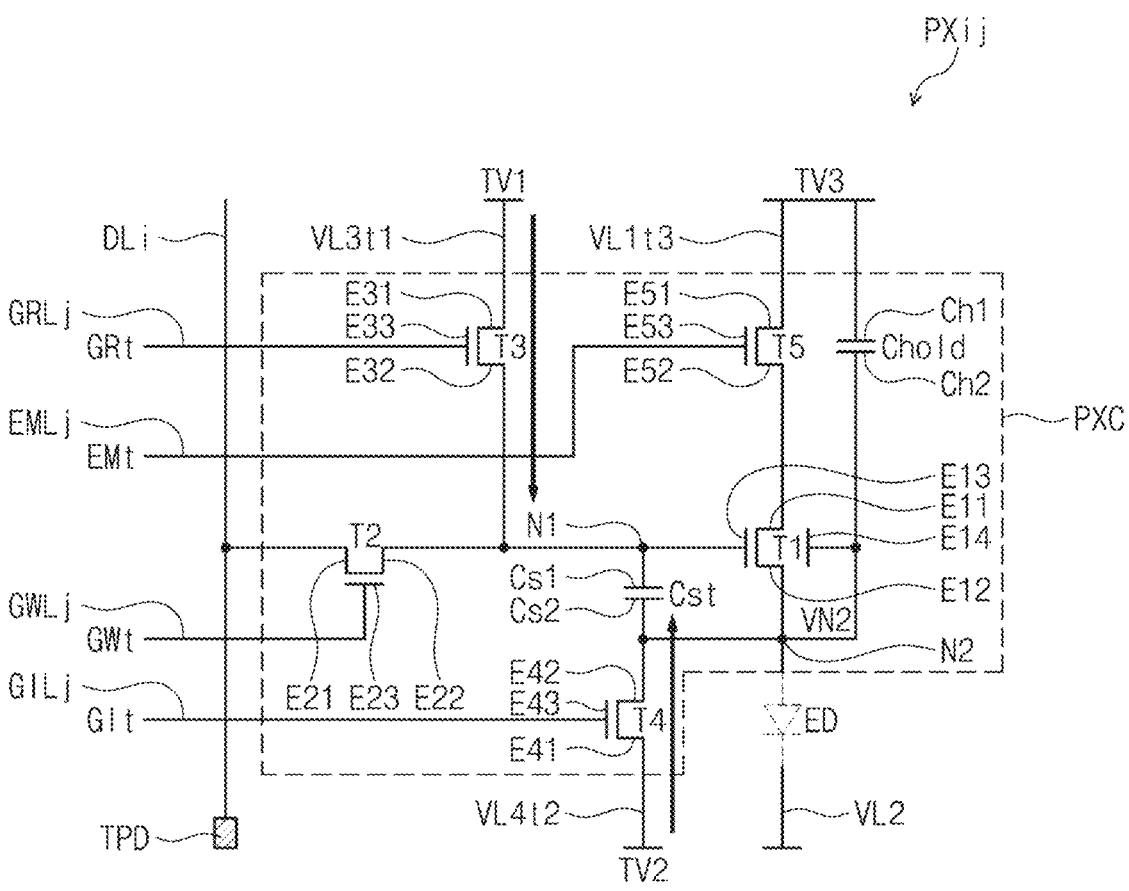
FIG. 4B is a diagram for describing an operation of a pixel circuit in a third section illustrated in FIG. 3.
Figure 4C:
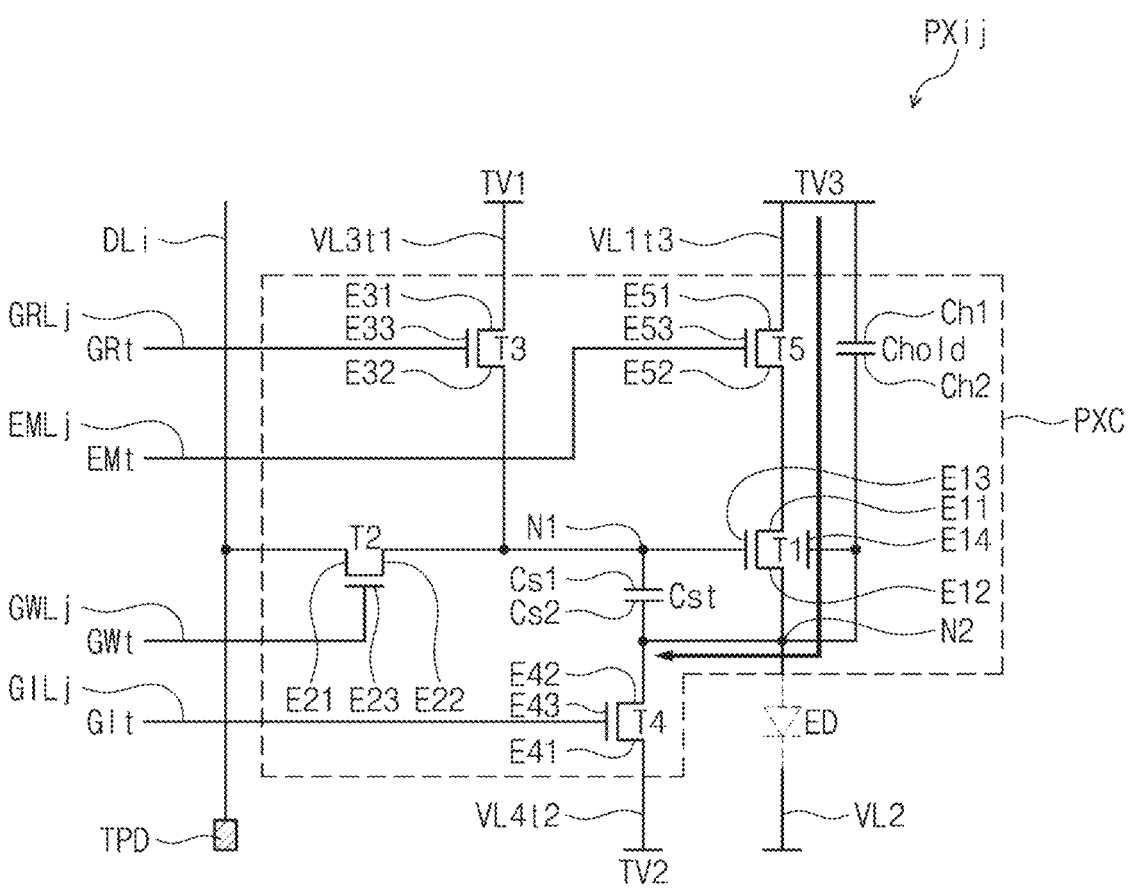
FIG. 4C is a diagram for describing an operation of a pixel circuit in a fourth section illustrated in FIG. 3.
Figure 4D:
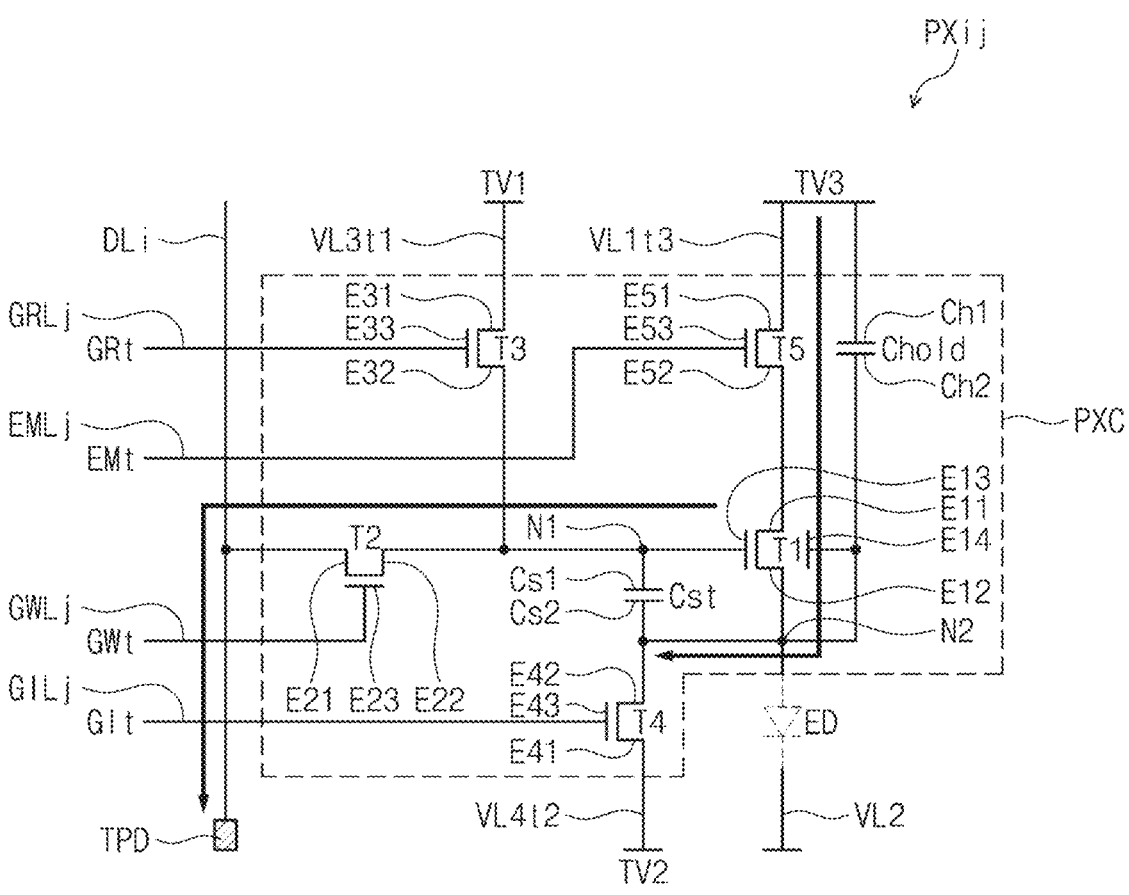
FIG. 4D is a diagram for describing an operation of a pixel circuit in a fifth section illustrated in FIG. 3.

FIG. 3 is a timing diagram for describing a test operation of a pixel circuit, according to an embodiment of the present disclosure. FIG. 4A is a diagram for describing an operation of a pixel circuit in a second section illustrated in FIG. 3. FIG. 4B is a diagram for describing an operation of a pixel circuit in a third section illustrated in FIG. 3. FIG. 4C is a diagram for describing an operation of a pixel circuit in a fourth section illustrated in FIG. 3. FIG. 4D is a diagram for describing an operation of a pixel circuit in a fifth section illustrated in FIG. 3.

Referring to FIG. 3, an emission control signal EMt transitions from an active level (e.g., a high level) to an inactive level (e.g., a low level) in a first section TP1. Accordingly, the fifth thin film transistor T5 may be turned off in the first section TP1.

Referring to FIGS. 3 and 4A, the second section TP2 is a stage in which a first test voltage TV1 is provided to the first node N1. In the second section TP2, a scan signal GRt transitions from the inactive level to the active level. The third thin film transistor T3 is turned on, and the first test voltage TV1 provided through a first test voltage line VL3t*l* may be transferred to the first node N1. That is, a voltage VN1 of the first gate electrode E13 of the first thin film transistor T1 (in other words, a voltage VN1 of the first node N1) may be initialized with the first test voltage TV1. For example, the first test voltage TV1 may be 5 volts (V), but is not limited thereto. The first test voltage line VL3t*l* may correspond to the third driving voltage line VL3 illustrated in FIG. 2.

Referring to FIGS. 3 and 4B, the third section TP3 is a stage in which the second test voltage TV2 is provided. In the second section TP3, a scan signal GIt transitions from the inactive level to the active level. The fourth thin film transistor T4 is turned on, and a second test voltage TV2 provided through a second test voltage line VL4t2 may be transferred to the second node N2. That is, A voltage VN2 of the second node N2 may be initialized with the second test voltage TV2. The second test voltage TV2 may be a different voltage from the first test voltage TV1, and the absolute value of the second test voltage TV2 may be actually the same as the absolute value of the first test voltage TV1. For example, the second test voltage TV2 may be −5V, but is not limited thereto. The second test voltage line VL4t2 may correspond to the fourth driving voltage line VL4 illustrated in FIG. 2.

When the scan signal GIt transitions from the active level to the inactive level, the third section TP3 ends. The scan signal GRt may continuously maintain the active level while the scan signal GIt has the active level. The scan signal GRt may transition to the inactive level after the scan signal GIt transitions to the inactive level.

Referring to FIGS. 3 and 4C, a fourth section TP4 is a stage in which a third test voltage TV3 is provided. In the fourth section TP4, the emission control signal EMt transitions from the inactive level to the active level. The fifth thin film transistor T5 is turned on, and the third test voltage TV3 provided through a third test voltage line VL1t3 may be transferred to the second node N2 through the fifth thin film transistor T5 and the first thin film transistor T1. By the third test voltage TV3 transferred to the second node N2, a voltage of the first node N1, that is, the voltage VN1 of the first gate electrode E13 of the first thin film transistor T1 may be boosted up. The third test voltage line VL1t3 may correspond to the first driving voltage line VL1 illustrated in FIG. 2.

The third test voltage TV3 may be a voltage different from each of the first and second test voltages TV1 and TV2, and may be a voltage of a greater level than each of the first and second test voltages TV1 and TV2. For example, the third test voltage TV3 may be 10V, but is not limited thereto.

Referring to FIGS. 3 and 4D, a fifth section TP5 is a stage of detecting a defect in the pixel circuit PXC. In the fifth section TP5, a scan signal GWt transitions from the inactive level to the active level. The second thin film transistor T2 may be turned on. The voltage VN1 of the first node N1 may be transferred through the second thin film transistor T2 and the data line DLi. For example, the voltage VN1 of the first node N1 may be measured through the test pad TPD connected to the data line DLi.

According to the test operation of the pixel circuit PXC illustrated in FIGS. 3 and 4A to 4D, after the third thin film transistor T3 is turned on, the fourth thin film transistor T4 may be turned on. Thereafter, after the fourth thin film transistor T4 is turned off, the third thin film transistor T3 may be turned off. After both the third thin film transistor T3 and the fourth thin film transistor T4 are turned off, the fifth thin film transistor T5 is turned on, and while the fifth thin film transistor T5 is turned on, the second thin film transistor T2 may be turned on and then turned off.

In FIG. 3, a voltage VN1n of the first node N1 and a voltage VN2n of the second node N2 in the normal state, and a voltage VN1e of the first node N1 and a voltage VN2e of the second node N2 in the defective state are illustrated as an example. In an embodiment, for example, a plurality of pixel circuits PXC may be provided, and a plurality of test pads TPD may also be provided. When the voltages VN1 received from the test pads TPD are actually at the same level, respectively, it may be determined as a good product (e.g., product operated normally in a pixel level). On the other hand, when an abnormal voltage VN1e having a difference DFR from the normal voltage VN1n among the voltages VN1 is detected, it may be determined as a bad product (e.g., product operated abnormally in a pixel level), and follow-up actions may be taken. For example, when the abnormal voltage VN1e having the difference DFR from the normal voltage VN1n is detected, it may be estimated that there is a problem in the first thin film transistor T1 or the fifth thin film transistor T5.

Figure 5:
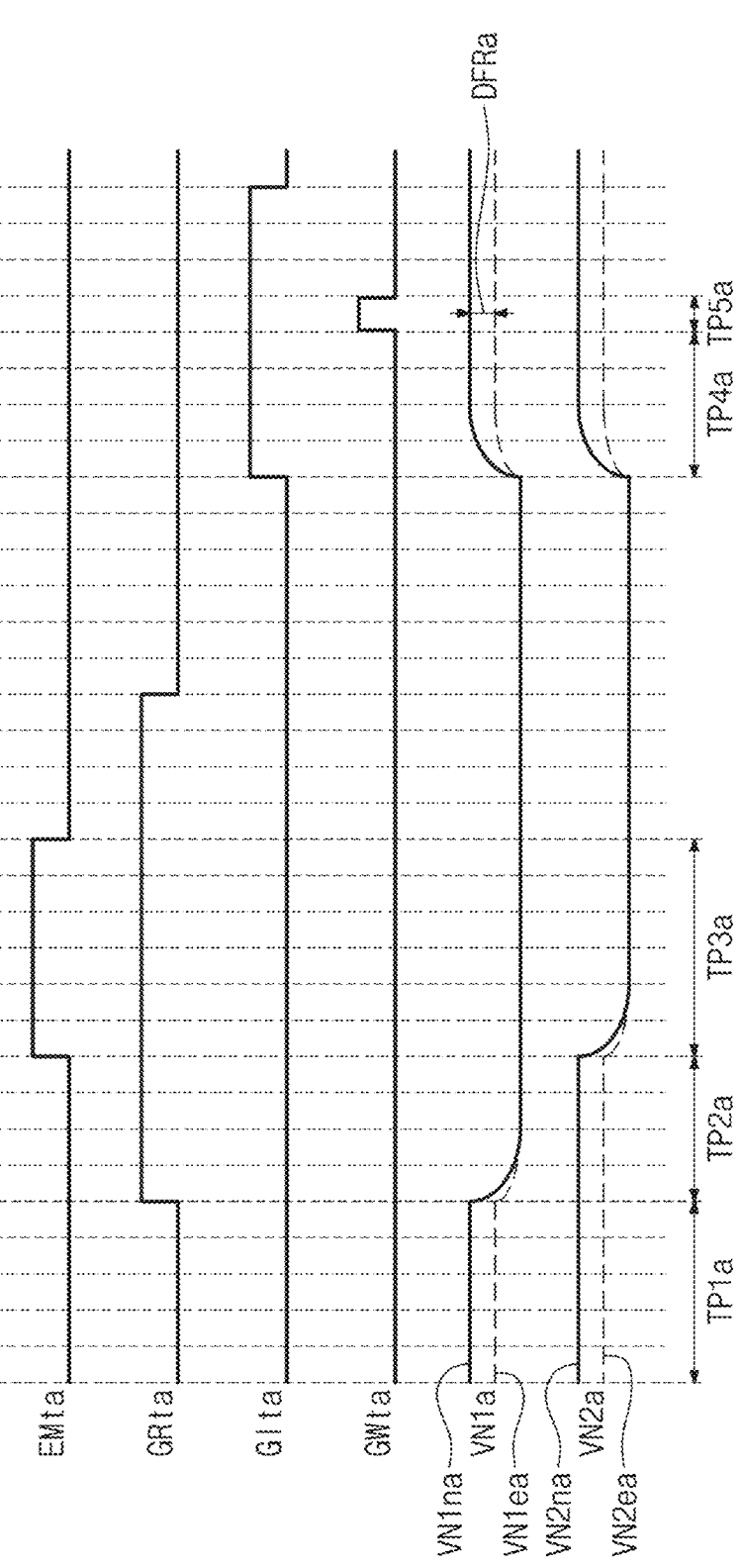
FIG. 5 is a timing diagram for describing a test operation of a pixel circuit, according to another embodiment of the present disclosure.
Figure 6A:
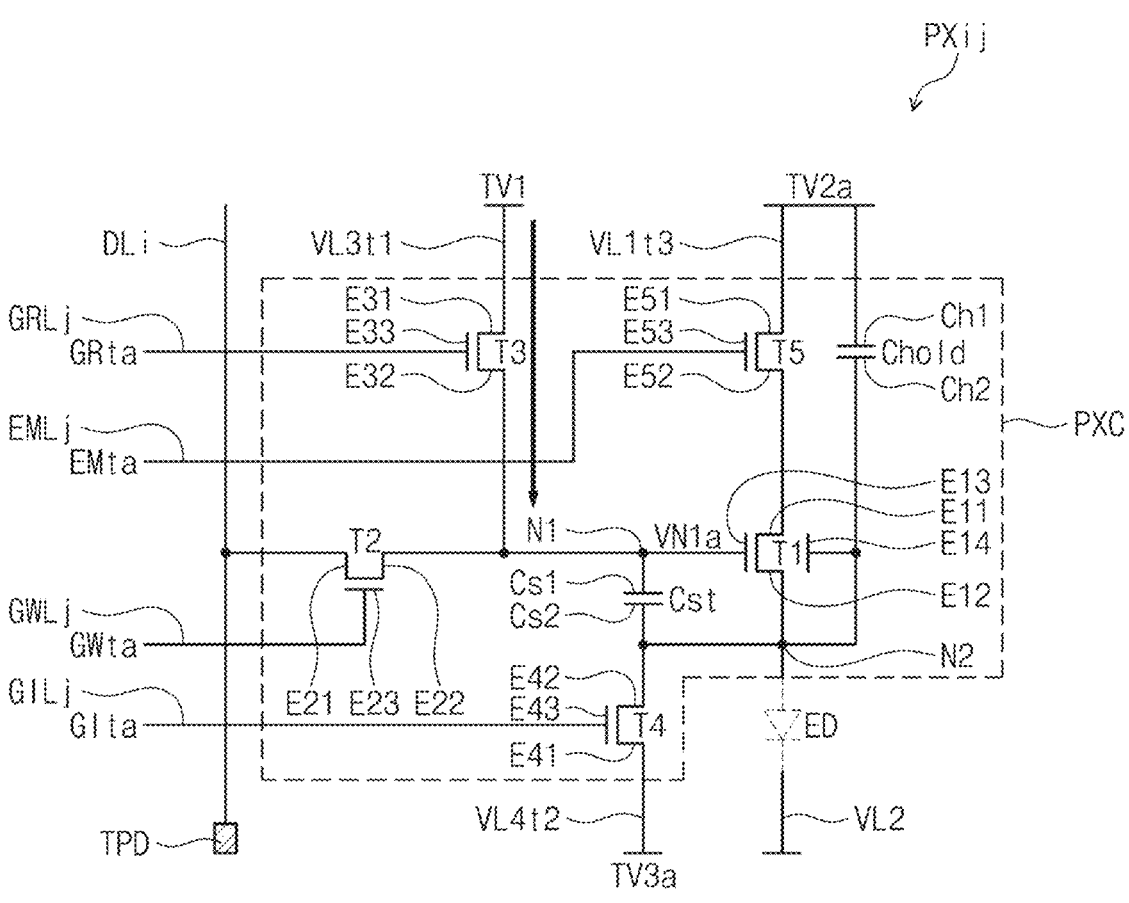
FIG. 6A is a diagram for describing an operation of a pixel circuit in a second section illustrated in FIG. 5.
Figure 6B:
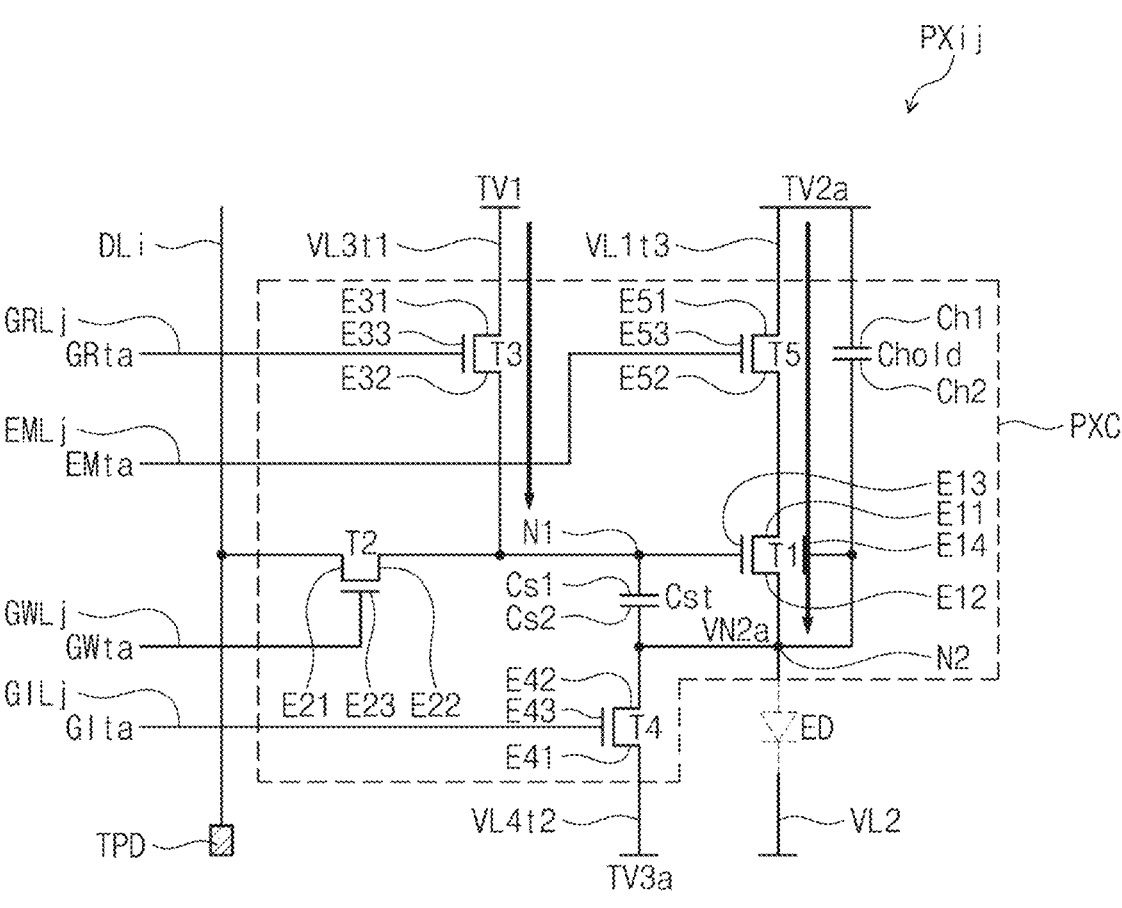
FIG. 6B is a diagram for describing an operation of a pixel circuit in a third section illustrated in FIG. 5.
Figure 6C:
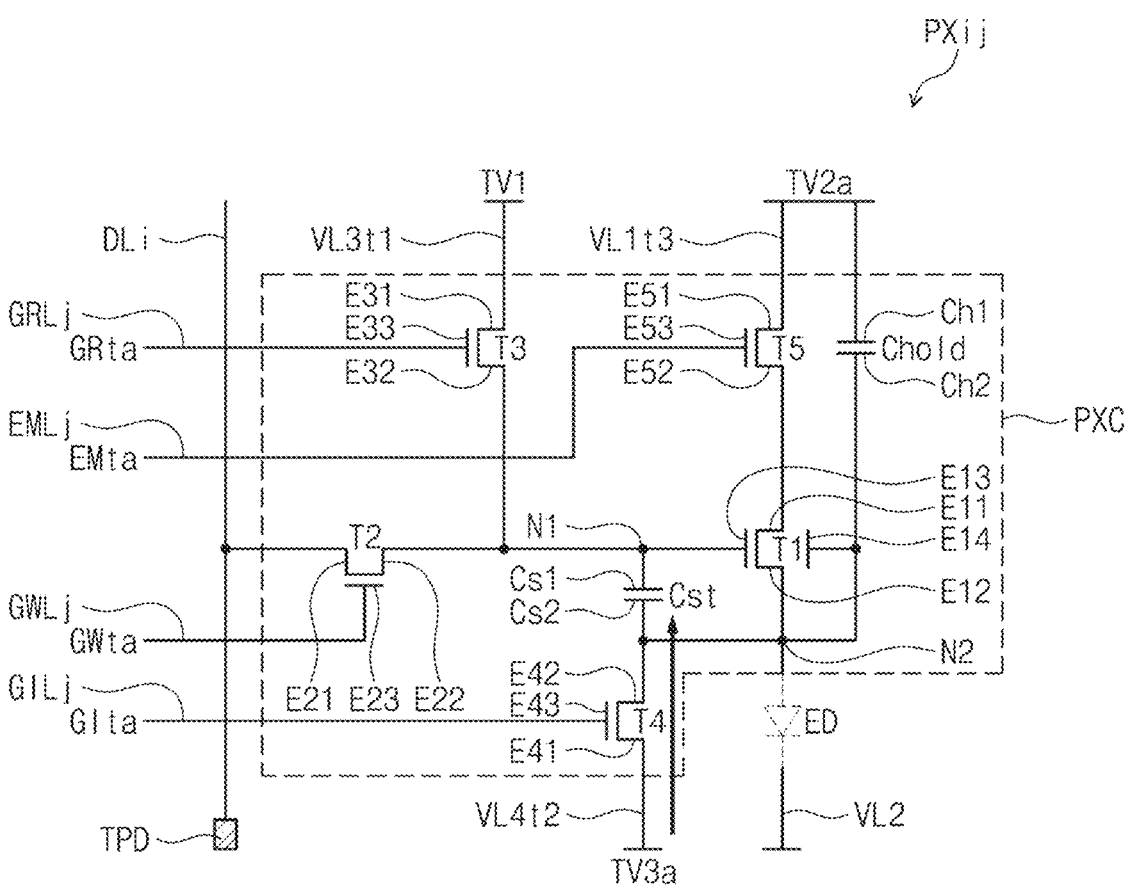
FIG. 6C is a diagram for describing an operation of a pixel circuit in a fourth section illustrated in FIG. 5.
Figure 6D:
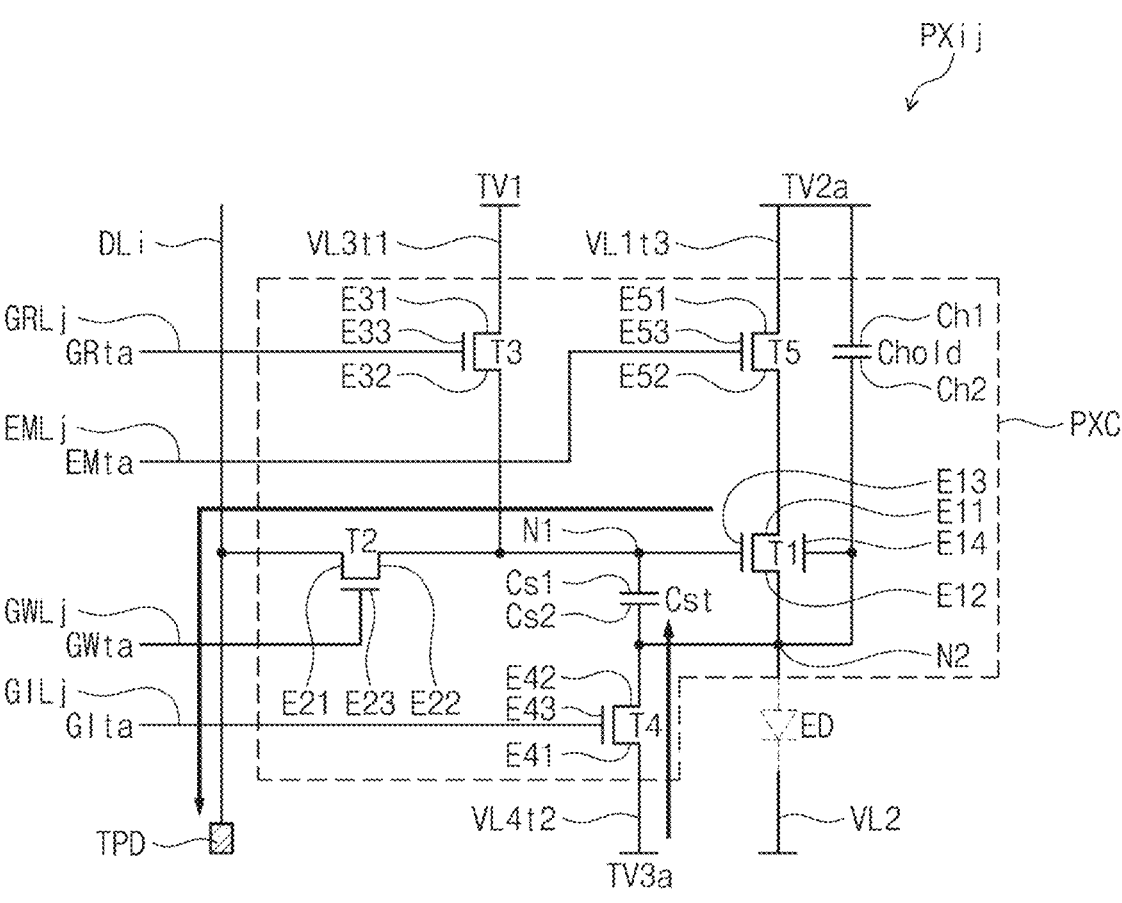
FIG. 6D is a diagram for describing an operation of a pixel circuit in a fifth section illustrated in FIG. 5.

FIG. 5 is a timing diagram for describing a test operation of a pixel circuit, according to another embodiment of the present disclosure. FIG. 6A is a diagram for describing an operation of a pixel circuit in a second section illustrated in FIG. 5. FIG. 6B is a diagram for describing an operation of a pixel circuit in a third section illustrated in FIG. 5. FIG. 6C is a diagram for describing an operation of a pixel circuit in a fourth section illustrated in FIG. 5. FIG. 6D is a diagram for describing an operation of a pixel circuit in a fifth section illustrated in FIG. 5.

Referring to FIG. 5, an emission control signal EMta is in the inactive level (e.g., a low level) state in a first section TP1a. Accordingly, in the first section TP1a, the fifth thin film transistor T5 may maintain a turned-off state.

Referring to FIGS. 5 and 6A, a second section TP2a is a stage in which the first test voltage TV1 is provided to the first node N1. In the second section TP2a, a scan signal GRta transitions from the inactive level to the active level (e.g., a high level). The third thin film transistor T3 is turned on, and the first test voltage TV1 provided through the first test voltage line VL3t*l* may be transferred to the first node N1. That is, a voltage VN1a of the first gate electrode E13 of the first thin film transistor T1 (in other words, a voltage VN1a of the first node N1) may be initialized with the first test voltage TV1. For example, the first test voltage TV1 may be 5V, but is not limited thereto.

Referring to FIGS. 5 and 6B, a third section TP3a is a stage in which a second test voltage TV2a is provided. In the third section TP3a, the emission control signal EMta transitions from the inactive level to the active level. The fifth thin film transistor T5 is turned on, and the second test voltage TV2a provided through the third test voltage line VL1t3 may be transferred to the second node N2 through the fifth thin film transistor T5 and the first thin film transistor T1. That is, a voltage VN2a of the second node N2 may be initialized with the second test voltage TV2a. The second test voltage TV2$a$ may be a different voltage from the first test voltage TV1, and the absolute value of the second test voltage TV2$a$ may be actually the same as the absolute value of the first test voltage TV1. For example, the second test voltage TV2$a$ may be −5V, but is not limited thereto.

When the emission control signal EMta transitions from the active level to the inactive level, the third section TP3$a$ ends. The scan signal GRta may continuously maintain the active level while the emission control signal EMta has the active level. The scan signal GRta may be transitioned to the inactive level after the emission control signal EMta is transitioned to the inactive level.

Referring to FIGS. 5 and 6C, a fourth section TP4$a$ is a stage in which a third test voltage TV3$a$ is provided. In the fourth section TP4$a$, a scan signal GIta transitions from the inactive level to the active level. The fourth thin film transistor T4 is turned on, and the third test voltage TV3$a$ provided through the second test voltage line VL4$t$2 may be transferred to the second node N2. By the third test voltage TV3$a$ transferred to the second node N2, a voltage of the first node N1, that is, the voltage VN1$a$ of the first gate electrode E13 of the first thin film transistor T1 may be boosted up. The third test voltage TV3$a$ may be a voltage different from each of the first and second test voltages TV1 and TV2$a$, and may be a voltage of a greater level than each of the first and second test voltages TV1 and TV2$a$. For example, the third test voltage TV3$a$ may be 10V, but is not limited thereto.

Referring to FIGS. 5 and 6D, a fifth section TP5$a$ is a stage of detecting a defect in the pixel circuit PXC. In the fourth section TP5$a$, a scan signal GWta transitions from the inactive level to the active level. The second thin film transistor T2 may be turned on. The voltage VN1$a$ of the first node N1 may be transferred to the test pad TPD through the second thin film transistor T2 and the data line DLi, and the voltage VN1$a$ of the first node N1 may be measured through the test pad TPD.

According to the test operation of the pixel circuit PXC illustrated in FIGS. 5 and 6A to 6D, after the third thin film transistor T3 is turned on, the fifth thin film transistor T5 may be turned on. Thereafter, after the fifth thin film transistor T5 is turned off, the third thin film transistor T3 may be turned off. After both the third thin film transistor T3 and the fifth thin film transistor T5 are turned off, the fourth thin film transistor T4 is turned on, and while the fourth thin film transistor T4 is turned on, the second thin film transistor T2 may be turned on and then turned off.

In FIG. 5, a voltage VN1$na$ of the first node N1 and a voltage VN2$na$ of the second node N2 in the normal state, and a voltage VN1$ea$ of the first node N1 and a voltage VN2$ea$ of the second node N2 in the defective state are illustrated as an example. In an embodiment, for example, a plurality of pixel circuits PXC may be provided, and a plurality of test pads TPD may also be provided. When the voltages VN1$a$ received from the test pads TPD, respectively, are actually at the same level, it may be determined as a good product (e.g., product operated normally in a pixel level). Alternatively, when an abnormal voltage VN1$ea$ having a difference DFRa from the normal voltage VN1$na$ among the voltages VN1$a$ is detected, it may be determined as a bad product (e.g., product operated abnormally in a pixel level), and follow-up actions thereof may be taken. For example, when the abnormal voltage VN1$ea$ is detected, it may be estimated that there is a problem in the fourth thin film transistor T4.

Figure 7:
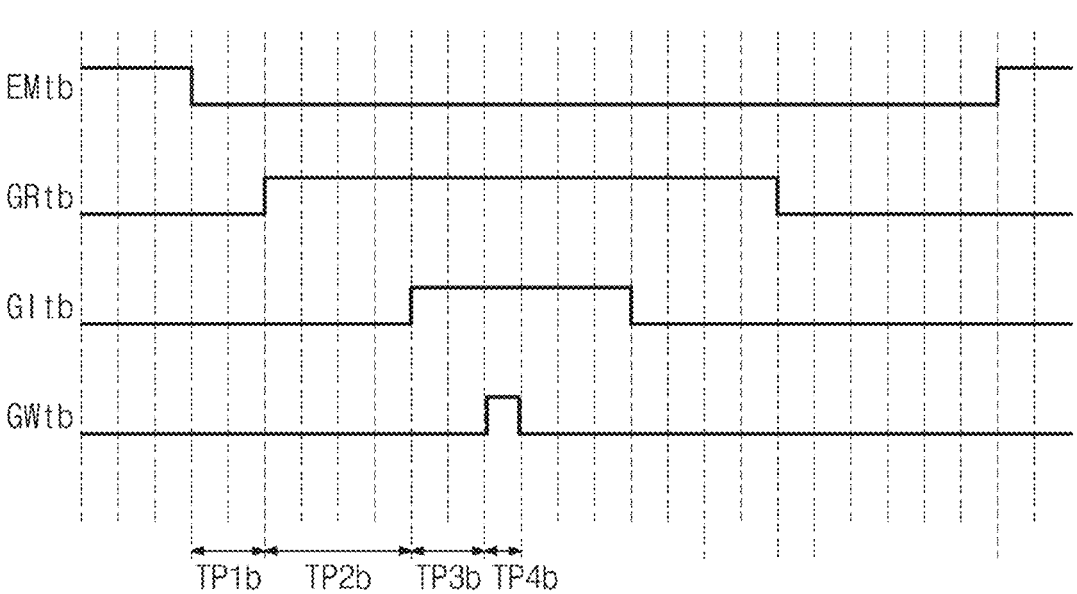
FIG. 7 is a timing diagram for describing a test operation of a pixel circuit, according to still another embodiment of the present disclosure.
Figure 8:
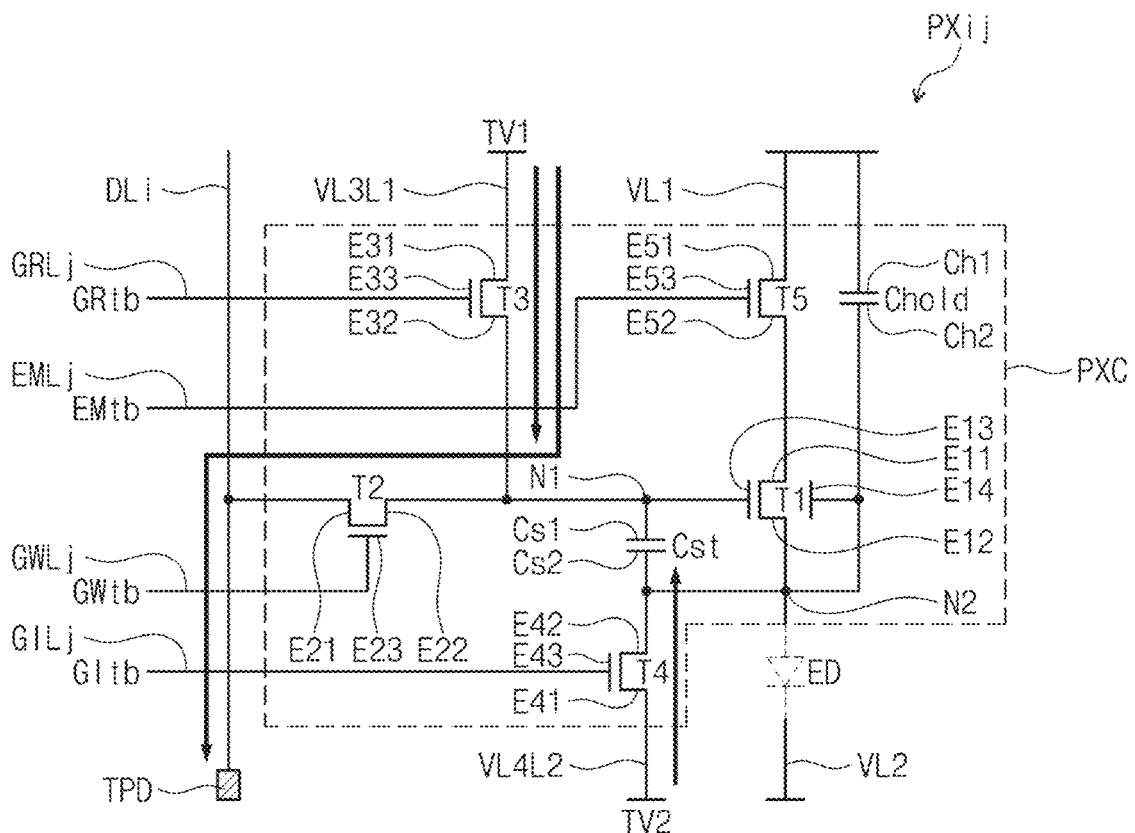
FIG. 8 is a diagram for describing an operation of a pixel circuit in a fourth section illustrated in FIG. 7.

FIG. 7 is a timing diagram for describing a test operation of a pixel circuit, according to still another embodiment of the present disclosure. FIG. 8 is a diagram for describing an operation of a pixel circuit in a fourth section illustrated in FIG. 7.

Referring to FIGS. 7 and 8, an emission control signal EMtb transitions from the active level (e.g., a high level) to the inactive level (e.g., a low level) in a first section TP1$b$. Accordingly, the fifth thin film transistor T5 may be turned off in the first section TP1$b$.

A second section TP2$b$ is a stage in which the first test voltage TV1 is provided to the first node N1. In the second section TP2$b$, a scan signal GRtb transitions from the inactive level to the active level. The third thin film transistor T3 is turned on, and the first test voltage TV1 provided through the first test voltage line VL3$tl$ may be transferred to the first node N1. An operation of the second section TP2$b$ may be the same as the operation described above with reference to FIG. 4A.

A third section TP3$b$ is a stage in which the second test voltage TV2 is provided. In the second section TP3$b$, a scan signal GItb transitions from the inactive level to the active level. The fourth thin film transistor T4 is turned on, and the second test voltage TV2 provided through the second test voltage line VL4$t$2 may be transferred to the second node N2. An operation of the third section TP3$b$ may be the same as the operation described above with reference to FIG. 4B.

A fourth section TP4$b$ illustrated in FIG. 8 is a stage of detecting a defect in the pixel circuit PXC. In the fourth section TP4$b$, a scan signal GWtb transitions from the inactive level to the active level. The second thin film transistor T2 may be turned on. A current flowing through the third thin film transistor T3, the second thin film transistor T2, and the data line DLi may be measured. When the measured current is lowered, it may be estimated that there is a problem in the operation of the third thin film transistor T3 or the fourth thin film transistor T4.

According to the test operation of the pixel circuit PXC illustrated in FIGS. 7 and 8, after the third thin film transistor T3 is turned on, the fourth thin film transistor T4 may be turned on. Thereafter, in a state in which both the third thin film transistor T3 and the fourth thin film transistor T4 are turned on, the second thin film transistor T2 may be turned on and then turned off. After that, after the second thin film transistor T2 is turned off, the fourth thin film transistor T4 may be turned off, and after the fourth thin film transistor T4 is turned off, the third thin film transistor T3 may be turned off.

For the array test of the pixel circuit PXC, the plurality of test voltages, for example, the first to third test voltages TV1, TV2, and TV3 or the first and second test voltages TV1 and TV2 may be applied to the pixel circuit PXC. When it is determined that the pixel circuit is defective through the array test, a repair process may be performed with respect to the pixel circuit, and when the repair of the pixel circuit is impossible, manufacturing of the pixel circuit may be terminated without proceeding to a subsequent process. Only when it is determined that the pixel circuit is normal through the array test, the light emitting element ED may be formed through a subsequent process. Waste of manufacturing time and manufacturing cost of the display panel DP (refer to FIG. 1) may be effectively reduced through the array test of the pixel circuit PXC.

The test operation described with reference to FIGS. 3 and 4A to 4D may be referred to as a first test operation, the test operation described with reference to FIGS. 5 and 6A to 6D may be referred to as a second test operation, and the test operation described with reference to FIGS. 7 and 8 may be referred to as a third test operation. When the array of the pixel circuit PXC is tested, any one of the first test operation, the second test operation, and the third test operation may be selected and performed. However, the present disclosure is not limited thereto. For example, the first and second test operations may be performed, the first and third test operations may be performed, the second and third test operations may be performed, or the first, second, and third test operations may be performed in other embodiments.

According an embodiment of the present disclosure, a plurality of test voltages may be applied to a pixel circuit to perform an array test of the pixel circuit. When it is determined that the pixel circuit is defective through the array test, a repair process may be performed with respect to the pixel circuit, and when the repair of the pixel circuit is impossible, manufacturing of the pixel circuit may be terminated without proceeding to a subsequent process. When it is determined that the pixel circuit is normal through the array test, a light emitting element may be formed through a subsequent process. Waste of manufacturing time and manufacturing cost of the display panel may be effectively reduced through the array test of the pixel circuit.

Although embodiments including the pixel circuit PXC including one or more thin film transistors are illustrated above, the kind of the transistors is not limited thereto. In another embodiment, a pixel circuit in which at least some of the transistors are substituted with MOSFET can be used for the first, second, or third test operations.

Although an embodiment of the present disclosure has been described for illustrative purposes, those skilled in the art will appreciate that various modifications, and substitutions are possible, without departing from the scope and spirit of the disclosure as disclosed in the accompanying claims. In addition, the embodiments disclosed in the present disclosure are not intended to limit the technical spirit of the present disclosure, and all technical ideas within the scope of the following claims and their equivalents should be construed as being included in the scope of the present disclosure.

What is claimed is:

1. A method of inspecting a display panel, the method comprising:
   testing a pixel circuit including a plurality of transistors and a capacitor in the display panel, and
   wherein the testing of the pixel circuit includes:
   providing a first test voltage to a first node to which a first electrode of the capacitor is directly connected;
   providing a second test voltage different from the first test voltage to a second node to which a second electrode of the capacitor is directly connected; and
   detecting a defect in the pixel circuit through a test transistor directly connected to the first node among the plurality of transistors,
   wherein the plurality of transistors includes:
   a first transistor including a first electrode, a second electrode directly connected to the second node, and a gate electrode directly connected to the first node.

2. The method of claim 1, wherein the plurality of transistors further includes:
   a second transistor connected between the first node and a data line;
   a third transistor connected to the first node and a first test voltage line;
   a fourth transistor connected to the second node and a second test voltage line; and
   a fifth transistor connected to the first electrode of the first transistor and a third test voltage line, and
   wherein the test transistor is the second transistor.

3. The method of claim 2, wherein the providing of the first test voltage includes:
   turning on the third transistor; and
   transferring the first test voltage provided through the first test voltage line to the first node through the third transistor.

4. The method of claim 3, wherein the providing of the second test voltage includes:
   turning on the fourth transistor; and
   transferring the second test voltage provided through the second test voltage line to the second node through the fourth transistor.

5. The method of claim 4, further comprising:
   providing a third test voltage different from the first and second test voltages to the second node, and
   wherein the providing of the third test voltage includes:
   turning on the fifth transistor; and
   transferring the third test voltage provided through the third test voltage line to the second node through the fifth transistor and the first transistor.

6. The method of claim 5, wherein a level of the third test voltage is greater than each of a level of the first test voltage and a level of the second test voltage.

7. The method of claim 5, wherein the detecting of the defect in the pixel circuit includes:
   turning on the second transistor; and
   measuring a voltage of the first node through the second transistor and the data line.

8. The method of claim 7, wherein, after the third transistor is turned on, the fourth transistor is turned on,
   after the fourth transistor is turned off, the third transistor is turned off,
   after both the third transistor and the fourth transistor are turned off, the fifth transistor is turned on, and
   while the fifth transistor is turned on, the second transistor is turned on and then turned off.

9. The method of claim 4, wherein the detecting of the defect in the pixel circuit includes:
   turning on the second transistor; and
   measuring a current flowing through the third transistor and the second transistor.

10. The method of claim 9, wherein, after the third transistor is turned on, the fourth transistor is turned on,
   after the fourth transistor is turned on, the second transistor is turned on,
   after the second transistor is turned off, the fourth transistor is turned off, and
   after the fourth transistor is turned off, the third transistor is turned off.

11. The method of claim 3, wherein the providing of the second test voltage includes:
   turning on the fifth transistor; and
   transferring the second test voltage provided through the third test voltage line to the second node through the fifth transistor and the first transistor.

12. The method of claim 11, further comprising:
   providing a third test voltage different from the first and second test voltages to the second node, and
   wherein the providing of the third test voltage includes:
   turning on the fourth transistor; and
   transferring the third test voltage provided through the second test voltage line to the second node through the fourth transistor.

13. The method of claim 12, wherein the detecting of the defect in the pixel circuit includes:
   turning on the second transistor; and measuring a voltage of the first node through the second transistor and the data line.

14. The method of claim 13, wherein, after the third transistor is turned on, the fifth transistor is turned on, after the fifth transistor is turned off, the third transistor is turned off, after both the third transistor and the fifth transistor are turned off, the fourth transistor is turned on, and while the fourth transistor is turned on, the second transistor is turned on and then turned off.

15. The method of claim 1, wherein the first test voltage is a positive voltage, and the second test voltage is a negative voltage.

16. The method of claim 15, wherein an absolute value of the first test voltage is the same as an absolute value of the second test voltage.

17. A method of manufacturing a display panel, the method comprising:

forming a pixel circuit including a plurality of transistors and a capacitor in the display panel;

testing the pixel circuit; and forming a light emitting element electrically connected with the pixel circuit, wherein the plurality of transistors includes:

a first transistor including a gate electrode connected to a first node, a first electrode, a second electrode connected to a second node;

a second transistor connected between the first node and a data line;

a third transistor connected to the first node and a first test voltage line;

a fourth transistor connected to the second node and a second test voltage line; and a fifth transistor connected to the first electrode of the first transistor and a third test voltage line, wherein the capacitor includes a first electrode connected to the first node and a second electrode connected to the second node, and wherein the testing of the pixel circuit includes:

providing a first test voltage to the first node;

providing a second test voltage different from the first test voltage to the second node; and detecting a defect in the pixel circuit through the second transistor.

18. The method of claim 17, wherein the testing of the pixel circuit further includes providing a third test voltage different from the first and second test voltages to the second node, wherein the providing of the first test voltage includes:

turning on the third transistor; and transferring the first test voltage provided through the first test voltage line to the first node through the third transistor, wherein the providing of the second test voltage includes:

turning on the fourth transistor; and transferring the second test voltage provided through the second test voltage line to the second node through the fourth transistor, wherein the providing of the third test voltage includes:

turning on the fifth transistor; and transferring the third test voltage provided through the third test voltage line to the second node through the fifth transistor and the first transistor, and wherein the detecting of the defect in the pixel circuit includes:

turning on the second transistor; and measuring a voltage of the first node through the second transistor and the data line.

19. The method of claim 17, wherein the testing of the pixel circuit further includes providing a third test voltage different from the first and second test voltages to the second node, wherein the providing of the first test voltage includes:

turning on the third transistor; and transferring the first test voltage provided through the first test voltage line to the first node through the third transistor, wherein the providing of the second test voltage includes:

turning on the fifth transistor; and transferring the second test voltage provided through the third test voltage line to the second node through the fifth transistor and the first transistor, wherein the providing of the third test voltage includes:

turning on the fourth transistor; and transferring the third test voltage provided through the second test voltage line to the second node through the fourth transistor, and wherein the detecting of the defect in the pixel circuit includes:

turning on the second transistor; and measuring a voltage of the first node through the second transistor and the data line.

20. The method of claim 17, wherein the providing of the first test voltage includes:

turning on the third transistor; and transferring the first test voltage provided through the first test voltage line to the first node through the third transistor, wherein the providing of the second test voltage includes:

turning on the fourth transistor; and transferring the second test voltage provided through the second test voltage line to the second node through the fourth transistor, and wherein the detecting of the defect in the pixel circuit includes:

turning on the second transistor; and measuring a current flowing through the third transistor and the second transistor.

* * * * *